United States Patent
Li et al.

(10) Patent No.: US 10,957,746 B2
(45) Date of Patent: Mar. 23, 2021

(54) TOUCH SUBSTRATE AND DISPLAY PANEL

(71) Applicant: BOE Technology Group Co., Ltd., Beijing (CN)

(72) Inventors: Changfeng Li, Beijing (CN); Xue Dong, Beijing (CN); Haisheng Wang, Beijing (CN); Yingming Liu, Beijing (CN); Xiaoliang Ding, Beijing (CN); Rui Xu, Beijing (CN); Pinchao Gu, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 318 days.

(21) Appl. No.: 16/080,896

(22) PCT Filed: Jan. 8, 2018

(86) PCT No.: PCT/CN2018/071717
§ 371 (c)(1),
(2) Date: Aug. 29, 2018

(87) PCT Pub. No.: WO2018/188392
PCT Pub. Date: Oct. 18, 2018

(65) Prior Publication Data
US 2020/0343311 A1 Oct. 29, 2020

(30) Foreign Application Priority Data
Apr. 13, 2017 (CN) .......................... 201710240413.0

(51) Int. Cl.
*H01L 27/32* (2006.01)
*G06F 3/041* (2006.01)
*G06K 9/00* (2006.01)

(52) U.S. Cl.
CPC .......... *H01L 27/323* (2013.01); *G06F 3/0412* (2013.01); *G06K 9/0004* (2013.01); *H01L 27/3234* (2013.01); *H01L 27/3246* (2013.01); *H01L 27/3272* (2013.01)

(58) Field of Classification Search
CPC .............. G06K 9/0012; G06K 9/0004; G06K 9/00087; G06K 9/00033; H01L 27/1462;
(Continued)

(56) References Cited

U.S. PATENT DOCUMENTS

2004/0263670 A1* 12/2004 Yamasaki ......... H01L 27/14623
348/340
2008/0031497 A1* 2/2008 Kishigami ......... G06K 9/00033
382/115
(Continued)

FOREIGN PATENT DOCUMENTS

| CN | 105867696 | 8/2016 |
| CN | 106022324 | 10/2016 |

(Continued)

OTHER PUBLICATIONS

International Search Report and Written Opinion of the International Searching Authority for corresponding PCT Application No. PCT/CN2018/071717(Foreign Text, 11 pages; English Translation, 5 pages) (Mar. 30, 2018).

*Primary Examiner* — Richard J Hong
(74) *Attorney, Agent, or Firm* — Myers Bigel, P.A.

(57) ABSTRACT

The present disclosure relates to the field of display technologies, and provides a touch substrate and a display panel. Specifically, the touch substrate comprises: a pixel array and a light sensing device array arranged oppositely; a light shielding layer between the pixel array and the light sensing device array; and a lens array on a side of the light shielding layer remote from the light sensing device array. The pixel array comprises a plurality of pixel units, each pixel unit
(Continued)

comprising a plurality of sub-pixels. The lens array comprises a plurality of lens units. The light sensing device array comprises a plurality of light sensing devices. The light shielding layer is provided with a plurality of via holes.

18 Claims, 2 Drawing Sheets

(58) Field of Classification Search
CPC ............ H01L 27/14623; H01L 27/323; H01L 27/3234; H01L 27/3246; H01L 27/3272; A61B 5/1172; G06F 3/0416; G06F 3/0412

See application file for complete search history.

(56) References Cited

U.S. PATENT DOCUMENTS

| | | |
|---|---|---|
| 2009/0206848 A1 | 8/2009 | Chuang et al. |
| 2009/0283772 A1 | 11/2009 | Cho et al. |
| 2010/0067757 A1* | 3/2010 | Arai ..................... G06K 9/0004 382/128 |
| 2012/0242884 A1* | 9/2012 | Ishiguro ............ H01L 27/14623 348/340 |
| 2014/0354905 A1* | 12/2014 | Kitchens ................ G06F 3/0416 349/12 |
| 2015/0187980 A1* | 7/2015 | Yamamoto ......... G06K 9/00087 250/552 |
| 2016/0035940 A1* | 2/2016 | Fujita ................... G06K 9/0004 438/29 |
| 2017/0103248 A1* | 4/2017 | Yamamoto .......... H01L 27/1462 |
| 2017/0193270 A1* | 7/2017 | Zhang .................. A61B 5/1172 |
| 2018/0012069 A1* | 1/2018 | Chung ................. G06K 9/0012 |
| 2018/0210571 A1 | 7/2018 | Wang et al. |
| 2019/0026530 A1 | 1/2019 | Wu et al. |

FOREIGN PATENT DOCUMENTS

| | | |
|---|---|---|
| CN | 106298859 | 1/2017 |
| CN | 106971173 | 7/2017 |

* cited by examiner

TOUCH SUBSTRATE AND DISPLAY PANEL

CROSS REFERENCE TO RELATED APPLICATIONS

The present application is a 35 U.S.C. 371 national stage application of PCT International Application No. PCT/CN2018/071717, filed on Jan. 8, 2018, which claims the benefit of Chinese patent application No. 201710240413.0, filed on Apr. 13, 2017, the contents of which are incorporated herein by reference in their entireties.

TECHNICAL FIELD

The present disclosure relates to the field of display technologies, and specifically discloses a touch substrate and a display panel.

BACKGROUND ART

Fingerprints are inherent and invariant features of a human body that are unique to a person and thus capable of distinguishing the person from others. They are composed of a series of ridges and valleys on a surface of skin at a fingertip. Details of the composition of ridges and valleys usually comprise branches of ridges, ends of ridges, arcs, tent-shaped arcs, levorotations, dextrorotations, spirals or double spirals. These details determine the uniqueness of patterns of the fingerprints. Fingerprint identification techniques developed therefrom have been used for personal identity authentication for a long time. Specifically, depending on differences in fingerprint acquisition and input manner, current sensors widely applied and well known include optical imaging sensors, heat sensitive sensors, human infrared sensors or the like.

SUMMARY

According to one aspect of the present disclosure, a touch substrate is provided. The touch substrate comprises: a pixel array and a light sensing device array arranged oppositely; a light shielding layer between the pixel array and the light sensing device array; and a lens array, wherein the lens array is located on a side of the light shielding layer remote from the light sensing device array. Specifically, the pixel array comprises a plurality of pixel units, wherein each pixel unit comprises a plurality of sub-pixels. Besides, the lens array comprises a plurality of lens units, wherein an orthogonal projection of each lens unit on the pixel array is located between two adjacent sub-pixels. Moreover, the light sensing device array comprises a plurality of light sensing devices, wherein an orthogonal projection of each light sensing device on the pixel array at least partially overlaps an orthogonal projection of a lens unit on the pixel array. In addition, the light shielding layer is provided with a plurality of via holes, wherein an orthogonal projection of each via hole on the pixel array at least partially overlaps an orthogonal projection of a lens unit on the pixel array.

According to an embodiment of the present disclosure, in the touch substrate as mentioned above, an orthogonal projection of each lens unit on the pixel array is located between two adjacent pixel units.

According to an embodiment of the present disclosure, the touch substrate as mentioned above further comprises a base. The base is located on a side of the light sensing device array close to the light shielding layer.

According to an embodiment of the present disclosure, in the touch substrate as mentioned above, the lens array is integrated into the pixel array, and the base is located between the light shielding layer and the light sensing device array.

Optionally, as an example, the pixel array further comprises a pixel definition layer for defining a plurality of sub-pixels in each pixel unit, wherein each sub-pixel comprises a first electrode, a light emitting layer and a second electrode arranged sequentially. Optionally, the first electrode is arranged in a same layer as the lens array. Further optionally, the pixel definition layer at least partially covers the first electrode and completely covers the lens array.

According to another embodiment of the present disclosure, in the touch substrate as mentioned above, the lens array is located between the light shielding layer and the pixel array, and the base is located between the lens array and the pixel array.

Optionally, as an example, the pixel array further comprises a pixel definition layer for defining a plurality of sub-pixels in each pixel unit, wherein each sub-pixel comprises a first electrode, a light emitting layer and a second electrode arranged sequentially. Optionally, the first electrode is located on a side of the base remote from the light sensing device array. Further optionally, the pixel definition layer at least partially covers the first electrode and completely covers the lens array.

According to yet another embodiment of the present disclosure, the touch substrate as mentioned above further comprises a base, wherein the base is located on a side of the light sensing device array remote from the light shielding layer. Optionally, in still another embodiment, the lens array is located on a side of the pixel array remote from the light shielding layer.

Optionally, as an example, the pixel array further comprises a pixel definition layer for defining a plurality of sub-pixels in each pixel unit, wherein each sub-pixel comprises a first electrode, a light emitting layer and a second electrode arranged sequentially. Optionally, the first electrode is located on a side of the light shielding layer remote from the light sensing device array. Further optionally, the pixel definition layer at least partially covers the first electrode and completely covers the lens array.

Optionally, in the touch substrate as provided by an embodiment of the present disclosure, the light sensing devices are made of monocrystalline silicon or a PIN material.

Optionally, in the touch substrate as provided by an embodiment of the present disclosure, the light shielding layer is made of a metallic material.

According to another aspect of the present disclosure, a display panel is further provided, comprising the touch substrate as described in any of the above embodiments; and a cover plate arranged opposite the touch substrate.

Optionally, in the display panel as provided by an embodiment of the present disclosure, a thickness H and a refractive index $n_1$ of the cover plate, a thickness L and a refractive index $n_2$ of the lens array in the touch substrate, and a thickness 1 and a refractive index n of a portion between the lens array and the cover plate are set such that an object field of view for a touch object above the cover plate has a radius smaller than or equal to 50 μm.

Optionally, according to an embodiment of the present disclosure, in the display panel as mentioned above, a radius r of each via hole is set such that light emitted from the pixel units leaves from an edge of the via hole after being reflected at an edge of the object field of view and refracted by the lens units.

Optionally, according to an embodiment of the present disclosure, in the above described display panel, a lateral dimension P of the light sensing devices in an extension plane of the display panel satisfies the following formula:

$$P = 2 \times \left( \frac{md}{L-h+dr} + r \right);$$

Wherein, L is a thickness of the lens array in the touch substrate, h is an arc height of the lens unit in the lens array, d is half a chord length of the lens unit, r is a radius of the via hole and m is an image distance.

DETAILED DESCRIPTION OF EMBODIMENTS

In order to help those skilled in the art to better understand technical solutions of the present disclosure, the present disclosure will be further described in detail with reference to the drawings and specific embodiments.

It should be pointed out that the expression of "being located between two adjacent sub-pixels" in the present disclosure does not necessarily mean that it completely overlaps a region between the two adjacent sub-pixels. On the contrary, the expression of "being located between two adjacent sub-pixels" can also mean that it is smaller than, greater than or exactly equal to that region between the two adjacent sub-pixels.

Besides, it should be further noted in the present disclosure that, the expression of "an orthogonal projection being located between two adjacent sub-pixels/pixel units" does not necessarily mean that there is such an orthogonal projection between each pair of adjacent sub-pixels/pixel units on the whole touch substrate. On the contrary, such an expression allows the following possibility: there is no orthogonal projection of any lens unit between a certain pair of adjacent sub-pixels/pixel units on the touch substrate.

Furthermore, it should be further emphasized that, although the base is arranged on a side of the light sensing device array close to or remote from the light shielding layer in embodiments of the present disclosure as an example, benefiting from teachings of the present disclosure, those skilled in the art can easily conceive of arranging the base in any other suitable places of the entire touch substrate upon specific needs, and the present disclosure is intended to cover all these possible solutions.

Moreover, it should be further pointed out that, in describing the present disclosure, positions of the lens array provided in the touch substrate as an example is only used for illustrating the principle of the present disclosure, instead of limiting the present application in any way. In other words, the lens array is not limited to be arranged in the pixel array, between the light shielding layer and the pixel array, or on a side of the pixel array remote from the light shielding layer. Instead, the lens array can be arranged in other places of the touch substrate upon specific needs.

Figure 1:
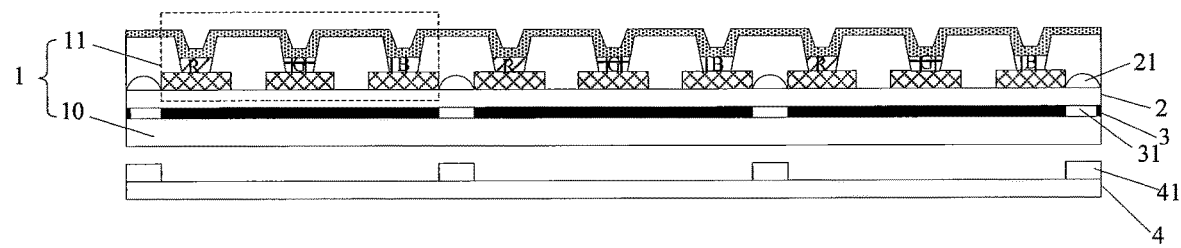
FIG. 1 shows a schematic structure view of a touch substrate according to an embodiment of the present disclosure.
Figure 2:
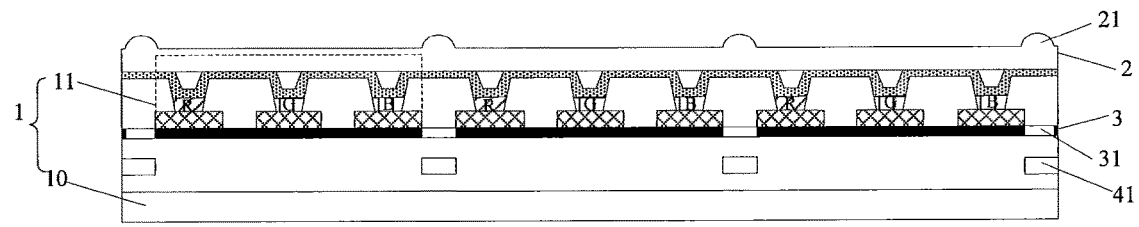
FIG. 2 shows a schematic structure view of a touch substrate according to another embodiment of the present disclosure.
Figure 3:
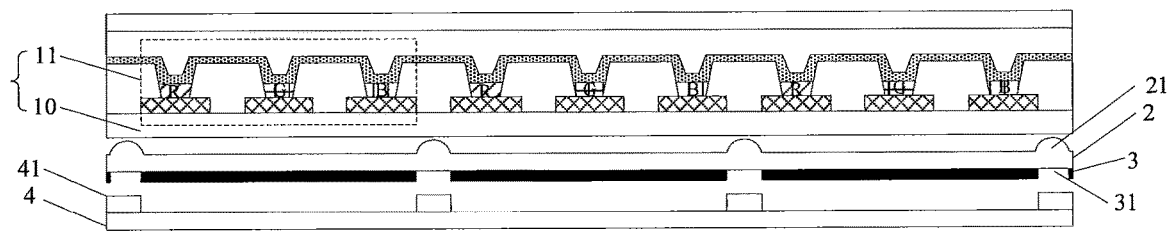
FIG. 3 shows a schematic structure view of a touch substrate according to yet another embodiment of the present disclosure.

With reference to FIGS. 1-3, embodiments of the present disclosure provide a touch substrate. The touch substrate can form, when arranged opposite a glass cover plate 5, a touch panel having a fingerprint identification function. Specifically, the touch substrate comprises a lens array 2, a pixel array 1, a light sensing device array 4 and a light shielding layer 3. As shown in the drawings, the lens array 2 comprises a plurality of lens units 21; the pixel array 1 comprises a plurality of pixel units 11, wherein an orthogonal projection of each lens unit on the pixel array is located between two adjacent pixel units; the light sensing device array 4 is located below the pixel array 1 and comprises a plurality of light sensing devices 41, wherein an orthogonal projection of each light sensing device on the pixel array at least partially overlaps an orthogonal projection of a corresponding lens unit on the pixel array; and the light shielding layer 3 is located on a side of the lens array 2 close to the light sensing device array 4. Besides, the light shielding layer 3 is provided with a plurality of via holes 31, wherein each via hole 31 is arranged to correspond to a lens unit 21. In other words, an orthogonal projection of each via hole on the pixel array at least partially overlaps an orthogonal projection of a lens unit on the pixel array.

As an example, in an embodiment, the pixel unit 11 comprises an organic light emitting diode (OLED). In this case, when the glass cover plate 5 of the touch panel is touched by fingers of a user, light emitted from the pixel units 11 on the touch substrate is incident onto valleys and ridges on a surface of the fingers of the user, and then reflected to the lens units 21. After that, the light is converged by the lens units 21 (e.g., focused at an edge of the via holes), and then incident onto the light sensing devices 41 of the light sensing device array 4 through a corresponding via hole 31 in the light shielding layer 3. Thereby, valleys and ridges can be differentiated by analyzing intensities of light reflected from valleys and ridges of the fingers. Besides, since the light shielding layer 3 is provided with via holes 31, light reflected from a farther region of the fingers will be occluded by the light shielding layer 3, and hence cannot pass through the via holes 31. In other words, light emitted out from the via holes 31 is only light reflected from a small area of the fingers, which limits the field of view. In this way, fingerprint information received from the fingerprint identification unit will be more accurate, which facilitate the differentiation between valleys and ridges of the fingers. Apparently, it can be further understood that the light shielding layer 3 is arranged on a side of the pixel array 1 facing away from a display face. Therefore, the aperture ratio of the touch panel will not be affected.

According to an optional implementation, as shown in FIG. 1, in the touch substrate, each pixel unit 11 in the pixel array 1 comprises a plurality of sub-pixels of different colors, wherein each sub-pixel comprises a first electrode, a light emitting layer and a second electrode. Specifically, the pixel array 1 further comprises a base 10 and a pixel definition layer. For each pixel, the first electrode is located above the base 10, the pixel definition layer is located above the first electrode, and the light emitting layer and the second electrode are arranged above the pixel definition layer sequentially. In the touch substrate, the lens array 2 is located between the first electrode and the base 10 in the pixel array 1; the light shielding layer 3 is located between the lens array 2 and the base 10; and the light sensing device array 4 is located on a side of the base 10 facing away from the light shielding layer 3, wherein each via hole 31 corresponds to a light sensing device.

According to another optional implementation, as shown in FIG. 2, in the touch substrate, the lens array 2 is located above the second electrode of the sub-pixel in each pixel unit 11; the light shielding layer 3 is located between the base 10 and the first electrode of the sub-pixel in each pixel unit 11; and the light sensing device array 4 is located between the light shielding layer 3 and the base 10. In this case, the light sensing device array 4 will be arranged on the base 10 of the pixel array 1. Therefore, no light sensing device 41 needs to be fabricated on a separate base 10, which decreases the production cost and avoids thickness increase of the touch substrate.

According to yet another optional implementation, as shown in FIG. 3, in the touch substrate, the lens array 2 is located on a side of the base 10 facing away from the first electrode; and the light shielding layer 3 is located on a side of the lens array 2 close to the light sensing device array 4.

In the above implementations, the lens array 2 is arranged between the base 10 and the pixel units 11 of the pixel array 1, so as to avoid optical interferences of light emitted from the pixel units 11 by the lens array 2 and thus influences on normal display. Besides, the light shielding layer 3 provided with small holes is further fabricated below the lens layer. In this case, materials suitable for the light shielding layer 3 can be metals or other light shielding materials. An optical device is fabricated right below the via holes 31, which optical device can be monocrystalline silicon or PIN or any other optical device, and the present disclosure will not be limited herein.

It should be noted that, in this embodiment, the pixel unit 11 further comprises a thin film transistor connected with the first electrode of the sub-pixel (OLED), and the light shielding layer 3 can also be arranged in a same layer as a gate or a source-drain of the thin film transistor. In other words, the via holes 31 are arranged in a same layer as the gate or the source-drain of the thin film transistor. In this way, they can be formed by one patterning process, so no extra process step will be added.

Figure 4:
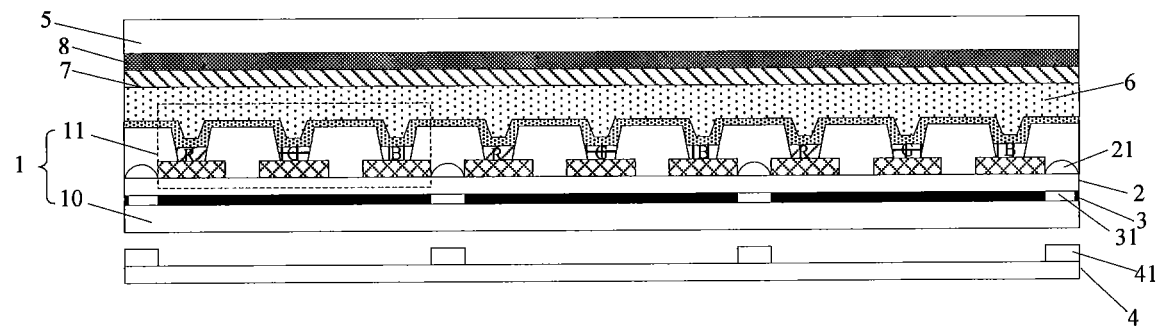
FIG. 4 shows a schematic structure view of a display panel according to an embodiment of the present disclosure.

As shown in FIG. 4, embodiments of the present disclosure further provide a display device. Specifically, the display device comprises the touch substrate as described in any of the above embodiments, and a cover plate 5 arranged opposite the touch substrate. Obviously, an encapsulation layer 6, a polarizer 7 and an optically clear adhesive layer 8 can be further arranged sequentially above a cathode of each sub-pixel (OLED device) of the touch substrate. Specifically, the encapsulation layer 6 is used for encapsulating the OLED device, so as to prevent the OLED device from being polluted by external vapors, particles or the like. In addition, the polarizer 7 is used for preventing glare, and the optically clear adhesive (OCA) layer 8 is used for bonding the touch substrate and the cover plate 5 together.

Figure 5:
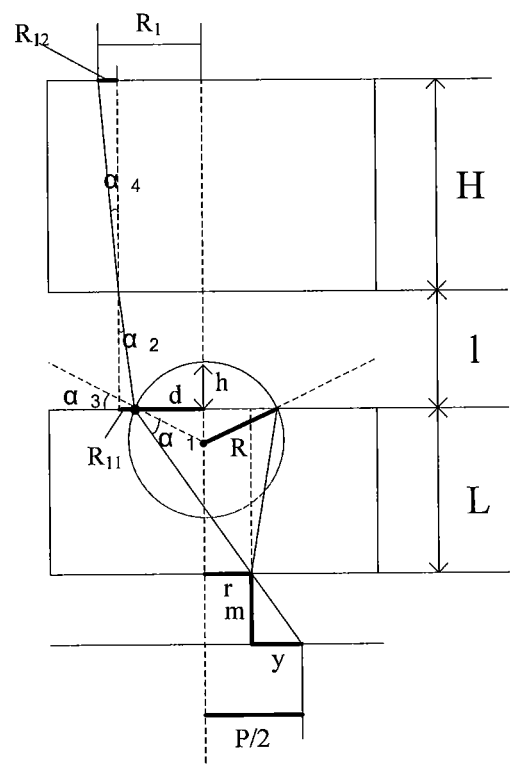
FIG. 5 shows a structure relationship diagram of each layer in a display panel according to another embodiment of the present disclosure.

As shown in FIG. 5, in an embodiment of the present disclosure, a thickness H and a refractive index $n_1$ of the cover plate 5, a thickness L and a refractive index $n_2$ of the lens array 2 in the touch substrate, and a thickness 1 and a refractive index n of a portion between the lens array 2 and the cover plate 5 are set such that an object field of view for a touch object above the cover plate 5 has a radius smaller than or equal to 50 μm.

It should be noted that the radius of the object field of view refers to a range of angles within which light emitted from the pixel unit 11 (i.e., the OLED device) can enter the lens unit 21 after being reflected by the touch object above the cover plate 5. An interval portion between the lens array 2 and the cover plate 5 can be air, or each film layer between the lens units 21 and the cover plate 5 in the touch substrate as a whole. Assuming that the interval portion consists of all film layers, i.e., the thickness is a sum of thicknesses of all film layers. In this case, the refractive index n is an average or an approximate average of the refractive index of each film layer.

In an embodiment of the present disclosure, a thickness H and a refractive index $n_1$ of the cover plate 5, a thickness L and a refractive index $n_2$ of the lens array 2 of the touch substrate, and a thickness 1 and a refractive index n of the interval portion between the lens array 2 and the cover plate 5 are set such that an object field of view for a touch object above the cover plate 5 has a radius smaller than or equal to 50 μm. In this way, a more accurate image of the touch object can be obtained. To take valleys and ridges of a finger as an example, if the object field of view has a smaller radius, the obtained information about the valleys and the ridges can be clearer, and thus the fingerprint detection can be more accurate. Specifically, for example, the refractive index $n_2$ of the lens array 2 is 1.5, the refractive index $n_1$ of the cover plate 5 is 1.46, and the chord length radius of the lens unit is d, with reference to FIG. 5, the following relationships can be obtained:

$$\tan(\alpha 1 + \alpha 3) = \frac{(L - h)}{d} + r,$$

$$\tan\alpha 3 = \frac{(R - h)}{d},$$

$$d = \sqrt{R^2 - (5 - h)^2},$$

$$\frac{\sin\alpha 1}{\sin\alpha 2} = 1.46,$$

$$\tan(\alpha 2 + \alpha 3) = \frac{(l + h)}{R11},$$

$$\frac{\sin(\frac{\pi}{2} - \alpha 2 - \alpha 3)}{\sin\alpha 4} = 1.5,$$

$$\tan\alpha 4 = \frac{R12}{H}, \text{ and}$$

$$R1 = R12 + R11 + d.$$

In the above relationships, the chord length radius d of the lens unit is half the chord length of the lens unit 21; R is a radius of the lens unit 21; and h is an arc height of the lens unit 21.

Further optionally, in the display panel as provided by an embodiment of the present disclosure, a radius r of each via hole 31 is set such that light emitted from the pixel units 11 can leave from an edge of the via hole after being reflected at an edge of the object field of view and refracted by the lens units 21.

Furthermore, a lateral dimension P of the light sensing devices 41 in an extension plane of the display panel, i.e., a range defined by light emitted out from the edge of the via holes 31, satisfies the following relationship: P=2×(r+y), as shown in FIG. 5. In this case, since $$\tan(\alpha 1 + \alpha 3) = \frac{m}{y} \text{ and } \tan(\alpha 1 + \alpha 3) = \frac{(L-h)}{d} + r,$$

it can be derived that $$y = \frac{md}{L - h + dr}.$$

This means that the lateral dimension P of the light sensing devices 41 satisfies the following formula:

$$P = 2 \times \left( \frac{md}{L - h + dr} + r \right),$$

wherein, L is a thickness of the lens array in the touch substrate, h is an arc height of the lens unit in the lens array, d is half a chord length of the lens unit, r is a radius of the via hole and m is an image distance.

Under such an arrangement, the light sensing devices can accurately detect light reflected from the touch object (such as a finger), and thus more accurate fingerprint identification can be achieved. It can be understood that the above embodiments are only exemplary embodiments as adopted for illustrating the principle of the present disclosure, but the present disclosure is not limited thereto. For a person having ordinary skills in the art, various variations and improvements can be made without deviating from the spirit and essence of the present disclosure, and these variations and improvements are also considered as falling within the protection scope of the present disclosure.

LIST OF REFERENCE NUMERALS

1—pixel array;
10—base;
11—pixel unit;
2—lens array;
21—lens unit;
3—light shielding layer;
31—via hole;
4—light sensing device array;
41—light sensing device;
5—cover plate;
6—encapsulation layer;
7—polarizer; and
8—optically clear adhesive layer.

The invention claimed is:

1. A display panel, comprising a touch substrate and a cover plate arranged opposite the touch substrate, wherein the touch substrate comprises:
   a pixel array;
   a light sensing device array that is opposite the pixel array;
   a light shielding layer between the pixel array and the light sensing device array; and
   a lens array on the light shielding layer remote from the light sensing device array,
   wherein the pixel array comprises a plurality of pixel units, ones of the plurality of pixel units comprising a plurality of sub-pixels,
   wherein the lens array comprises a plurality of lens units,
   wherein orthogonal projections of ones of the lens units on the pixel array are between adjacent sub-pixels,
   wherein the light sensing device array comprises a plurality of light sensing devices,
   wherein orthogonal projections of ones of the light sensing devices on the pixel array at least partially overlap respective orthogonal projections of respective lens units on the pixel array,
   wherein the light shielding layer comprises a plurality of via holes, wherein orthogonal projections of ones of the via holes on the pixel array at least partially overlap respective orthogonal projections of respective lens units on the pixel array,
   wherein a thickness H and a refractive index $n_1$ of the cover plate, a thickness L and a refractive index $n_2$ of the lens array in the touch substrate, and a thickness 1 and a refractive index n of a portion between the lens array and the cover plate correspond to an object field of view for a touch object above the cover plate having a radius less than or equal to 50 μm.

2. The display panel according to claim 1,
wherein a radius r of a via hole of the plurality of via holes corresponds to light emitted from a corresponding pixel unit of the plurality of pixel units exiting from an edge of the via hole after being reflected at an edge of the object field of view and refracted by a corresponding lens unit of the plurality of lens units.

3. The display panel according to claim 2,
wherein a lateral dimension P of a light sensing device of the plurality of light sensing devices in an extension plane of the display panel satisfies the following formula:

$$P = 2 \times \left( \frac{md}{L - h + dr} + r \right),$$

and
wherein L is a thickness of the corresponding lens array in the touch substrate, h is an arc height of the corresponding lens unit in the lens array, d is half a chord length of the corresponding lens unit, r is a radius of the via hole, and m is an image distance.

4. The display panel according to claim 1,
wherein the orthogonal projections of the ones of the lens units on the pixel array are between adjacent pixel units.

5. The display panel according to claim 1, further comprising:
a base between the light sensing device array and the light shielding layer.

6. The display panel according to claim 5,
wherein the lens array is integrated into the pixel array.

7. The display panel according to claim 6,
wherein the pixel array further comprises a pixel definition layer comprising the plurality of sub-pixels in one of the pixel units, and
wherein at least one of the plurality of sub-pixels comprises a first electrode, a light emitting layer and a second electrode arranged sequentially.

8. The display panel according to claim 7,
wherein the first electrode is in a same layer as the lens array.
9. The display panel according to claim 8,
wherein the pixel definition layer at least partially covers the first electrode and completely covers the lens array.
10. The display panel according to claim 1,
wherein the lens array is between the light shielding layer and the pixel array, and
wherein the touch substrate further comprises a base between the lens array and the pixel array.
11. The display panel according to claim 10,
wherein the pixel array further comprises a pixel definition layer comprising the plurality of sub-pixels in one of the pixel units, and
wherein at least one of the plurality of sub-pixels comprises a first electrode, a light emitting layer and a second electrode arranged sequentially.
12. The display panel according to claim 11,
wherein the first electrode is on a side of the base remote from the light sensing device array.
13. The display panel according to claim 12,
wherein the pixel definition layer at least partially covers the first electrode and completely covers the lens array.
14. The display panel according to claim 1, further comprising:
a base on a side of the light sensing device array remote from the light shielding layer.
15. The display panel according to claim 14,
wherein the lens array is on a side of the pixel array remote from the light shielding layer.
16. The display panel according to claim 15,
wherein the pixel array further comprises a pixel definition layer comprising the plurality of sub-pixels in one of the pixel units, and
wherein at least one of the plurality of sub-pixels comprises a first electrode, a light emitting layer and a second electrode arranged sequentially.
17. The display panel according to claim 16,
wherein the first electrode is on a side of the light shielding layer remote from the light sensing device array.
18. The display panel according to claim 17,
wherein the pixel definition layer at least partially covers the first electrode and completely covers the lens array.

* * * * *